(12) United States Patent
Huang

(10) Patent No.: US 7,549,777 B2
(45) Date of Patent: Jun. 23, 2009

(54) WATERPROOF HEAT DISSIPATING STRUCTURE FOR ELECTRONIC SIGNBOARD

(75) Inventor: Chiao-Sheng Huang, Taipei (TW)

(73) Assignee: Agon-Tech. Corporation, Jhonghe (TW)

( * ) Notice: Subject to any disclaimer, the term of this patent is extended or adjusted under 35 U.S.C. 154(b) by 64 days.

(21) Appl. No.: 11/434,810

(22) Filed: May 17, 2006

(65) Prior Publication Data
US 2006/0262501 A1  Nov. 23, 2006

(30) Foreign Application Priority Data
May 20, 2005 (TW) ............... 94208191 U

(51) Int. Cl.
B60Q 1/06 (2006.01)
(52) U.S. Cl. ............... 362/373; 362/559; 362/812
(58) Field of Classification Search ........... 362/373, 362/812, 267, 559; 40/452, 624, 578; 361/694, 361/688
See application file for complete search history.

(56) References Cited

U.S. PATENT DOCUMENTS

| | | | |
|---|---|---|---|
| 4,751,911 A * | 6/1988 | Betts et al. ............ | 126/261 |
| 5,036,248 A | 7/1991 | McEwan et al. | |
| 5,632,551 A | 5/1997 | Roney et al. | |
| 5,715,619 A | 2/1998 | Polisois et al. | |
| 6,154,362 A | 11/2000 | Takahashi et al. | |
| 6,283,613 B1 | 9/2001 | Schaffer | |
| 6,329,593 B1 | 12/2001 | Yang | |
| 6,364,507 B1 | 4/2002 | Yang | |
| 2002/0139408 A1* | 10/2002 | Mitzner ............ | 135/115 |
| 2003/0196657 A1* | 10/2003 | Ging et al. ........... | 128/201.22 |
| 2006/0080778 A1* | 4/2006 | Chambers ........... | 5/652.2 |

* cited by examiner

Primary Examiner—Ali Alavi
(74) Attorney, Agent, or Firm—James J. Paige; Nikolai & Mersereau, P.A.

(57) ABSTRACT

A waterproof heat dissipating structure is provided on an electronic signboard having a main body with a first surface as a display and an opposite second surface, and includes at least one through hole provided on the second surface of the main body of the signboard, and at least one waterproof breathable unit provided at each through hole as a protective layer. The waterproof breathable unit has an area not smaller than that of the through hole, and has the property of allowing gas but not liquid to pass therethrough. Therefore, air inside the main body heated by the heat produced by the display at the first surface of the signboard may pass through the waterproof breathable unit at the through hole to carry away heat from the main body to achieve the purpose of heat dissipation and maintain the main body at a pressure balancing state.

19 Claims, 4 Drawing Sheets

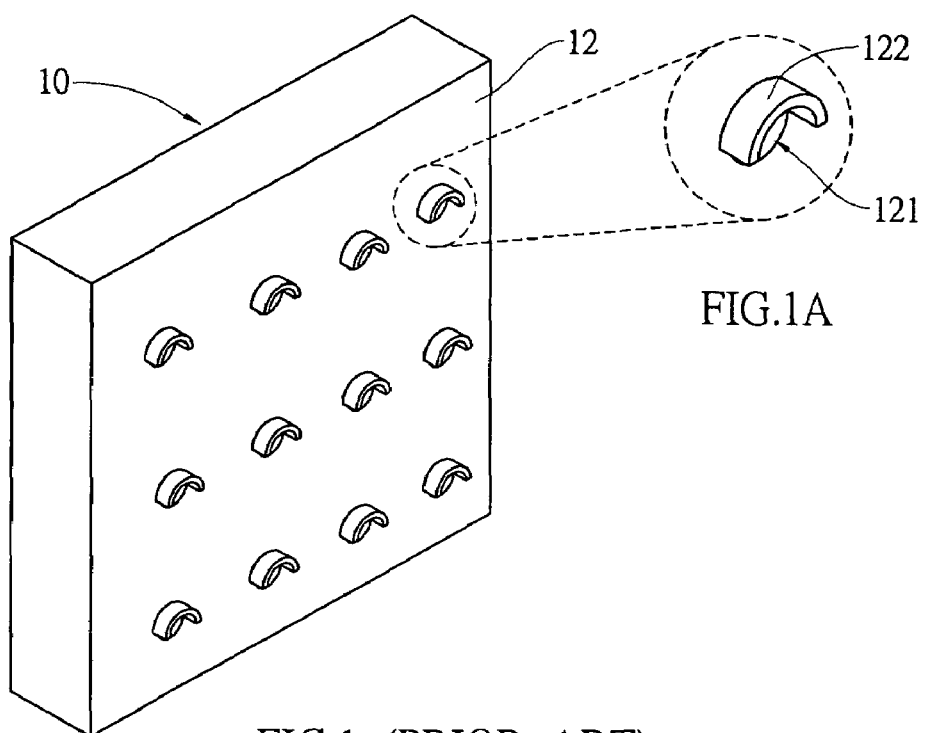
FIG.1A
FIG.1 (PRIOR ART)
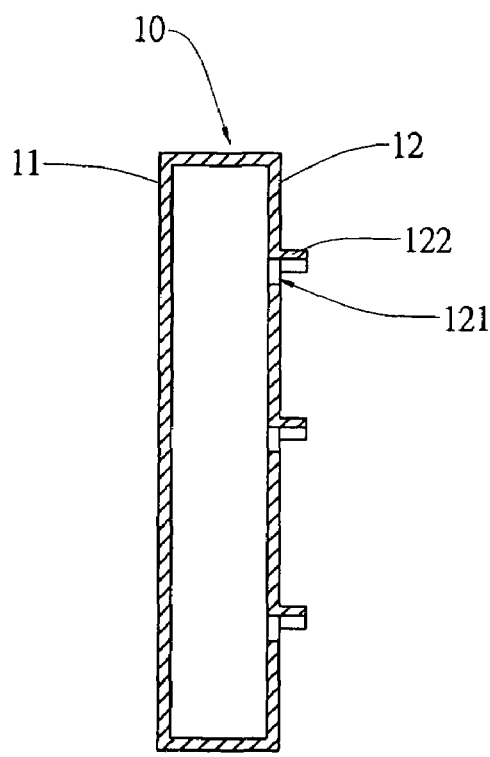
FIG.2 (PRIOR ART)

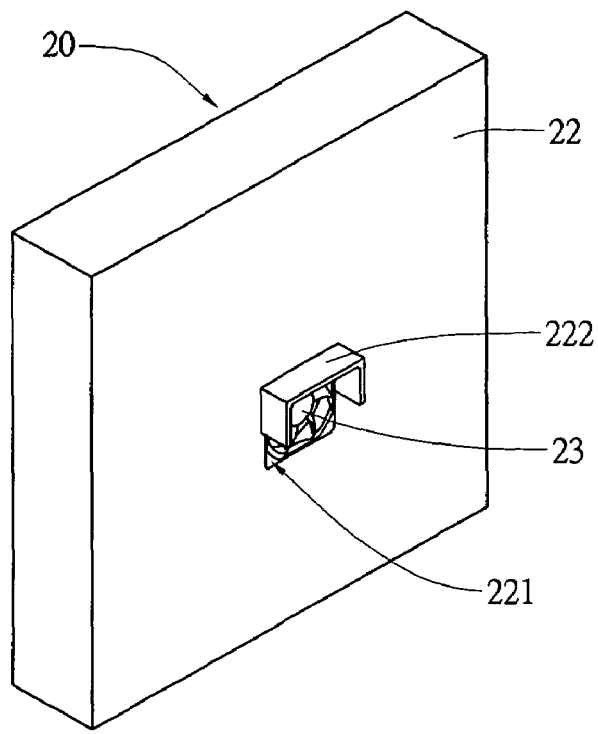
FIG.3 (PRIOR ART)
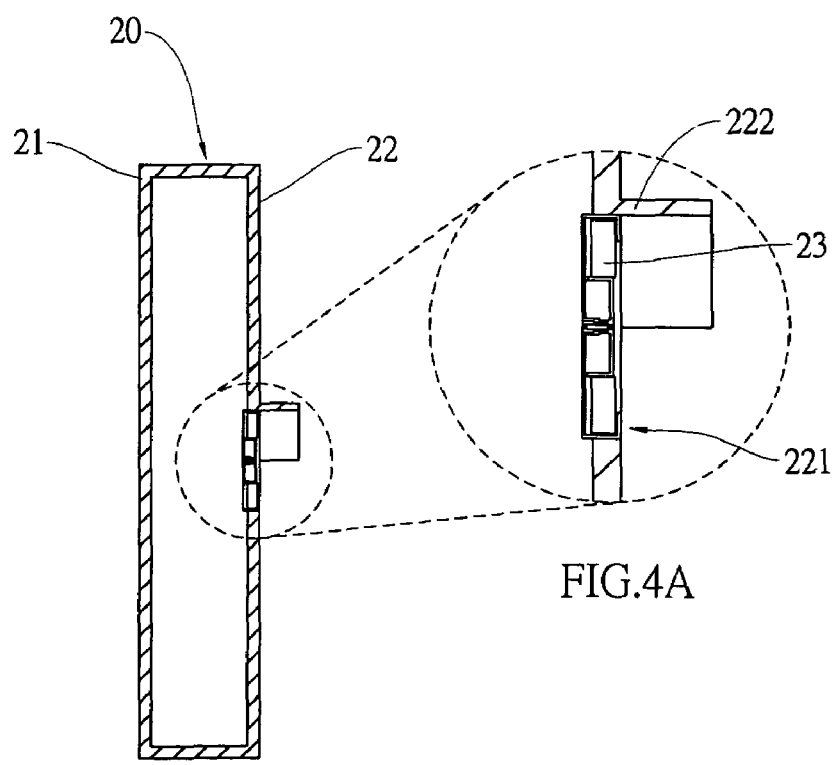
FIG.4A
FIG.4 (PRIOR ART)

WATERPROOF HEAT DISSIPATING STRUCTURE FOR ELECTRONIC SIGNBOARD

FIELD OF THE INVENTION

The present invention relates to a heat dissipating structure for an electronic signboard, and more particularly to a waterproof and breathable heat dissipating structure for an outdoor electronic signboard.

BACKGROUND OF THE INVENTION

The mass media play an important role in the nowadays information era. The announcement and promotion of governmental policies, the advertising of business images and products, the live telecast of stage performance, and the display of various information and messages in public places, all can be efficiently and effectively achieved through changeful mass media.

Among others, the electronic signboard is a very effective means to achieve ideal advertising effect. Through control via computers and link to Internet, the effect of the electronic signboard is expanded from local points to worldwide areas. Moreover, the current mass media display not only static graphic designs, but also dynamic images, making the electronic signboard more changeful and flexible to create much enhanced visual effects than other types of advertising media.

An outdoor electronic signboard usually has high brightness and light gathering power to therefore produce a large amount of heat during operation thereof. Moreover, since the outdoor electronic signboard is frequently subjected to sunlight, rainwater, and other weather factors, it must be designed to effectively dissipate heat and prevent water from entering into the signboard.

FIGS. 1 and 2 are perspective and sectioned side views, respectively, of an electronic signboard provided with a first type of conventional heat dissipating structure. The electronic signboard typically includes a main body 10 having a first surface 11 and an opposite second surface 12. The first surface 11 is a display for showing dynamic and/or static visual images. The second surface 12 is provided with a plurality of through holes 121, and a plurality of forward projected shielding covers 122 correspondingly located along an outer edge of the through holes 121. FIG. 1A is an enlarged view showing the shielding cover 122 on one through hole 121.

When the display at the first surface 11 of the main body 10 operates, components of the display in operating produce a high amount of heat, which raises a temperature of the gas inside the main body 10. Therefore, there is a temperature difference between the relatively hot fluid in the main body 10 and the relatively cold external air to cause a natural convection. That is, the hot fluid inside the main body 10 passes through the through holes 121 on the second surface 12 to diffuse into the external environment, so that heat is carried away from the main body 10 to maintain the main body 10 in a pressure balancing state. The projected shielding cover 122 also functions to stop or prevent rainwater and/or other liquid from entering into the main body 10.

However, in the practical application of the above-described first conventional heat dissipating structure for the electronic signboard, while a large part of liquid is stopped by the projected shielding covers 122 from entering into the main body 10 of the signboard, there is still a small part of liquid that flows down along the shielding covers 122 into the main body 10 via the through holes 121 to damage the display at the first surface 11.

FIGS. 3 and 4 are perspective and sectioned side views, respectively, of an electronic signboard provided with a second type of conventional heat dissipating structure. The electronic signboard includes a main body 20 having a first surface 21 and an opposite second surface 22. The first surface 21 is a display for showing dynamic and/or static visual images. The second surface 22 is provided with at least one through hole 221, a forward projected shielding cover 222 correspondingly located along an outer edge of the through hole 221, and a heat dissipating fan 23 mounted in the main body 20 corresponding to the through hole 221. FIG. 4A is an enlarged view showing the shielding cover 222 and the heat dissipating fan 23 at the through hole 221.

When the display at the first surface 21 of the main body 20 operates, components of the display in operating produce a high amount of heat, which raises a temperature of the gas inside the main body 20. The hot fluid inside the main body 20 is discharged by the heat dissipating fan 23 via the through holes 221 on the second surface 22 to diffuse into the external environment, so that heat produced by the display is forced to dissipate from the main body 20. The projected shielding cover 222 also functions to stop or prevent rainwater and/or other liquid from entering into the main body 20.

However, in the practical application of the above-described second conventional heat dissipating structure for the electronic signboard, the provision of the heat dissipating fan 23 would inevitably increase the cost of the electronic signboard, compared to the electronic signboard adopting the first type of conventional heat dissipating structure. Moreover, since the electronic signboard is located outdoors, it is frequently subjected to external environmental factors, such as dust. When the heat dissipating fan 23 rotates to discharge heat, dust in the air tends to adhere to and accumulate on the fan 23 to adversely reduce the heat dissipation efficiency of the fan 23. In a worse condition, the accumulated dust would even shorten the usable life of the fan 23 or cause frequent replacement or repair or maintenance of the fan 23. In addition, as in the first conventional heat dissipating structure, there is still a small part of liquid that would flow down along the shielding cover 222 to invade the main body 20.

It is therefore tried by the inventor to develop a waterproof heat dissipating structure for electronic signboard to eliminate the drawbacks existed in the conventional heat dissipating structure for electronic signboard.

SUMMARY OF THE INVENTION

A primary object of the present invention is to provide a waterproof heat dissipating structure for electronic signboard, including at least one waterproof breathable unit provided at a through hole formed at a second surface of a main body of the electronic signboard, so that external liquid is barred from entering into the main body via the through hole while air inside the main body heated by the heat produced by a display at a first surface of the electronic signboard may pass through the breathable unit and diffuse into the external environment to maintain the main body in a pressure balancing state.

Another object of the present invention is to provide a waterproof heat dissipating structure for electronic signboard, including at least one waterproof breathable unit provided at a through hole formed at a second surface of a main body of the electronic signboard, so that particulates, such as dust, contained in the external air is prevented from entering into the main body of the electronic signboard.

A further object of the present invention is to provide a waterproof heat dissipating structure for electronic signboard, including at least one waterproof breathable unit removably provided at a through hole formed at a second surface of a main body of the electronic signboard, so that the waterproof breathable unit may be removed from the through hole for cleaning and reused to reduce the cost of the signboard.

To achieve the above and other objects, the waterproof heat dissipating structure according to the present invention is provided on an electronic signboard having a main body with a first surface as a display and an opposite second surface, and includes at least one through hole provided on the second surface of the main body of the signboard, and at least one waterproof breathable unit provided at each through hole as a protective layer. The waterproof breathable unit has an area not less than that of the through hole, and has the property of allowing gas but not liquid to pass therethrough. Therefore, air inside the main body heated by the heat produced by the display at the first surface of the signboard may pass through the waterproof breathable unit at the through hole to carry away heat from the main body to achieve the purpose of heat dissipation and maintain the main body at a pressure balancing state.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 is a perspective view showing a first conventional heat dissipating structure provided at a surface of an electronic signboard;

FIG. 1A is an enlarged view of the circled area of FIG. 1;

FIG. 2 is a sectioned side view of FIG. 1;

FIG. 3 is a perspective view showing a second conventional heat dissipating structure provided at a surface of an electronic signboard;

FIG. 4 is a sectioned side view of FIG. 3;

FIG. 4A is an enlarged view of the circled area of FIG. 4;

DETAILED DESCRIPTION OF THE PREFERRED EMBODIMENTS

Figure 5:
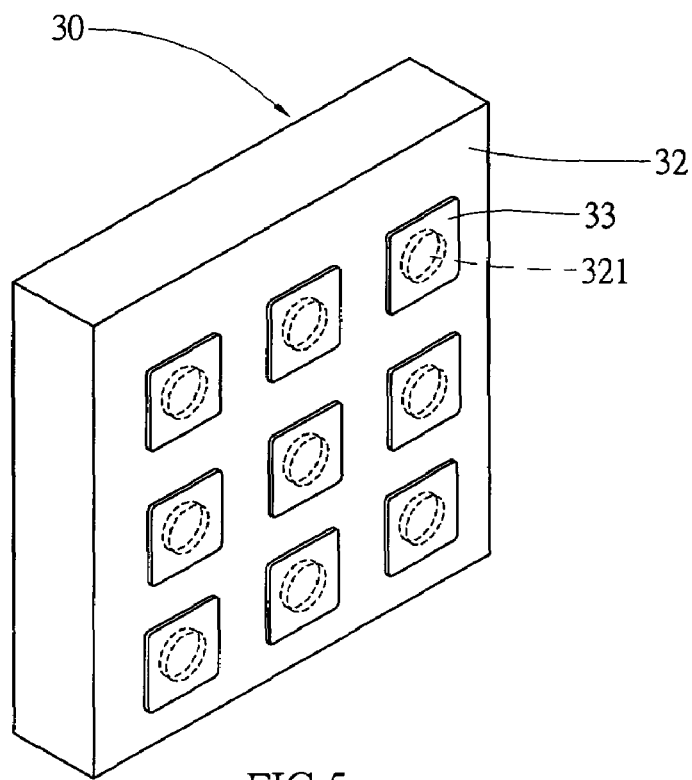
FIG. 5 is a perspective view showing a waterproof heat dissipating structure for electronic signboard according to a first embodiment of the present invention.
Figure 6:
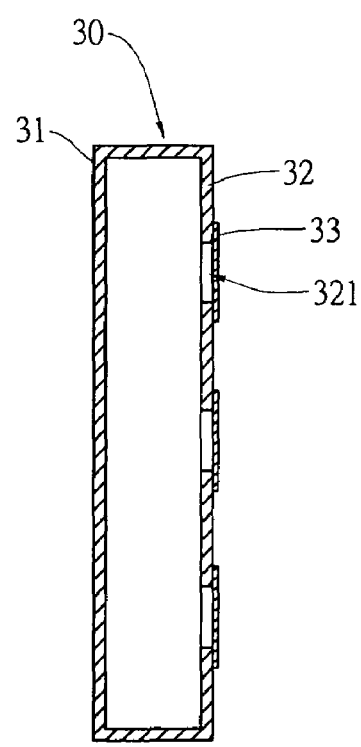
FIG. 6 is a sectioned side view of FIG. 5.

Please refer to FIGS. 5 and 6 that are perspective and sectioned side views, respectively, showing a waterproof heat dissipating structure for electronic signboard according to a first preferred embodiment of the present invention. The electronic signboard is designed for use outdoor and includes a main body 30 having a first surface 31 and a second surface 32 opposite to the first surface 31.

The first surface 31 of the electronic signboard is a display for displaying dynamic and/or static visual images to achieve the function of an advertising medium. The second surface 32 is provided at a predetermined position with at least one through hole 321.

The through hole 321 penetrates through the second surface 32 to communicate an internal space of the main body 30 with an external environment. At least one waterproof breathable unit 33 is provided at each through hole 321. The waterproof breathable unit 33 has an area not smaller than that of the through hole 321, and forms a protective layer without hindering the communication of the internal space of the main body 30 with the external environment. The waterproof breathable unit 33 is formed or provided with a plurality of micro pores that allow gas but not liquid to penetrate therethrough.

In the first embodiment of the present invention, the waterproof breathable unit 33 is tightly attached to an outer side of the through hole 321.

When the display at the first surface 31 of the electronic signboard operates, components of the display in operating produce a high amount of heat, which raises a temperature of the gas inside the main body 30. Therefore, there is a temperature difference between the relatively hot fluid in the main body 30 and the relatively cold external air to cause a natural convection. That is, the hot fluid inside the main body 30 passes through the waterproof breathable unit 33 to diffuse into the external environment via the through hole 321, so that heat is carried away from the main body 30 to maintain the main body 30 in a pressure balancing state. The waterproof breathable unit 33 also functions to prevent particles, such as dust, contained in external gas from entering into the main body 30.

When the main body 30 of the electronic signboard is subjected to external liquid, the waterproof breathable unit 33 having the water barring property may effectively prevent any external liquid flown to the through hole 321 from passing through the waterproof breathable unit 33 to enter into the main body 30.

Figure 7:
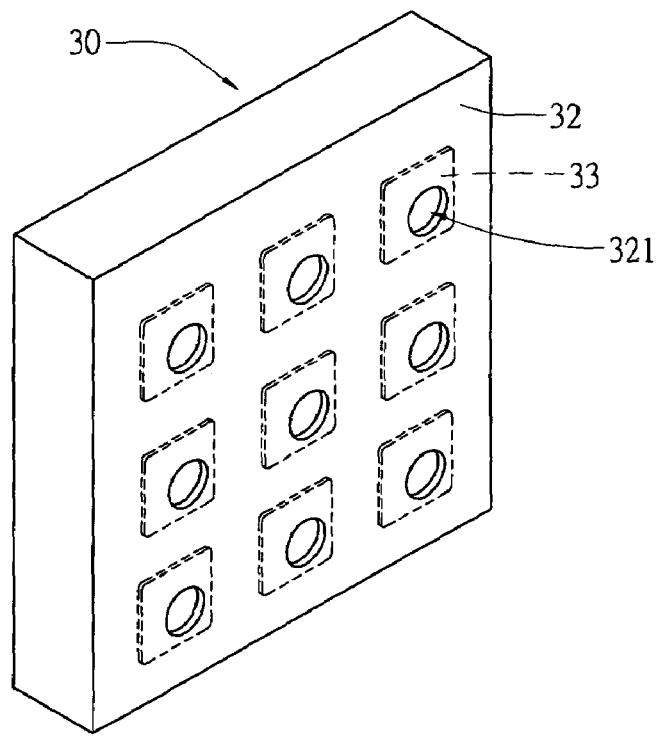
FIG. 7 is a perspective view showing a waterproof heat dissipating structure for electronic signboard according to a second embodiment of the present invention.
Figure 8:
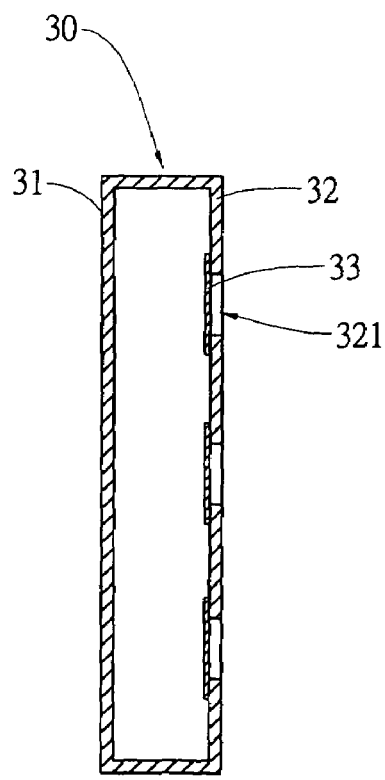
FIG. 8 is a sectioned side view of FIG. 7.

FIGS. 7 and 8 show another feasible embodiment of the present invention, in which the waterproof breathable unit 33 is tightly attached to an inner side of the through hole 321 to provide the same good effect as the first embodiment in terms of the ventilating, water barring, and dust guarding functions.

The waterproof breathable unit 33 may be made of a material selected from the group consisting of nylon, polypropylene (PP), polyethylene (PE), and polyester, and any combination thereof.

The waterproof breathable unit 33 is not necessarily fixedly attached to the inner or outer side of the through hole 321, but may be removably mounted to the inner or outer side of the through hole 321, so that the waterproof breathable unit 33 having been used over a period of time may be removed from the through hole 321 for cleaning and then replaced on the through hole 321. In this manner, the waterproof breathable unit 33 may always provide good ventilating and heat dissipating effect to largely reduce the cost of replacement for the unit 33.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A waterproof heat dissipating structure for electronic signboard, the electronic signboard comprising:

a main body having at least a first surface and a second surface opposite to said first surface, comprising at least one through hole provided on said second surface of said main body of said electronic signboard, at least one waterproof breathable unit correspondingly provided at said at least one through hole as a protective layer, said waterproof breathable unit is made of a material selected from the group consisting of nylon, polypropylene, polyethylene, and polyester, and any combination thereof, and each said waterproof breathable unit having an area not smaller than said through hole.

2. The waterproof heat dissipating structure for electronic signboard as claimed in claim 1, wherein said waterproof breathable unit is tightly attached to an inner side of each said through hole.

3. The waterproof heat dissipating structure for electronic signboard as claimed in claim 2, wherein said waterproof breathable unit is made of a material selected from the group consisting of nylon, polypropylene, polyethylene, and polyester, and any combination thereof.

4. The waterproof heat dissipating structure for electronic signboard as claimed in claim 1, wherein said first surface of said main body of said electronic signboard is a display for showing visual images.

5. The waterproof heat dissipating structure for electronic signboard as claimed in claim 1, wherein said waterproof breathable unit is formed or provided with a plurality of micro pores that allow gas but not liquid to penetrate therethrough.

6. The waterproof heat dissipating structure for electronic signboard as claimed in claim 5, wherein said waterproof breathable unit is removable from said through hole on said main body of said electronic signboard for cleaning and then replaced on said through hole.

7. The waterproof heat dissipating structure for electronic signboard as claimed in claim 6, wherein said waterproof breathable unit is made of a material selected from the group consisting of nylon, polypropylene, polyethylene, and polyester, and any combination thereof.

8. The waterproof heat dissipating structure for electronic signboard as claimed in claim 1, wherein said waterproof breathable unit is tightly attached to an outer side of each said through hole.

9. The waterproof heat dissipating structure for electronic signboard as claimed in claim 8, wherein said waterproof breathable unit is made of a material selected from the group consisting of nylon, polypropylene, polyethylene, and polyester, and any combination thereof.

10. The waterproof heat dissipating structure for electronic signboard as claimed in claim 1, wherein said waterproof breathable unit is removable from said through hole on said main body of said electronic signboard for cleaning and then replaced on said through hole.

11. The waterproof heat dissipating structure for electronic signboard as claimed in claim 10, wherein said waterproof breathable unit is made of a material selected from the group consisting of nylon, polypropylene, polyethylene, and polyester, and any combination thereof.

12. A waterproof heat dissipating structure for electronic signboard, the electronic signboard including a main body having at least a first surface and a second surface opposite to said first surface, comprising:

at least one through hole provided on said second surface of said main body of said electronic signboard;

at least one waterproof breathable unit correspondingly provided at said at least one through hole as a protective layer and said waterproof breathable unit is made of a material selected from the group consisting of nylon, polypropylene, polyethylene, and polyester, and any combination thereof; and each said waterproof breathable unit having an area not smaller than said through hole.

13. The waterproof heat dissipating structure for electronic signboard as claimed in claim 12, wherein said waterproof breathable unit is tightly attached to an inner side of each said through hole.

14. The waterproof heat dissipating structure for electronic signboard as claimed in claim 12, wherein said waterproof breathable unit is tightly attached to an outer side of each said through hole.

15. The waterproof heat dissipating structure for electronic signboard as claimed in claim 12, wherein said first surface of said main body of said electronic signboard is a display for showing visual images.

16. A waterproof heat dissipating structure for electronic signboard, the electronic signboard including a main body having at least a first surface and a second surface opposite to said first surface, comprising:

at least one through hole provided on said second surface of said main body of said electronic signboard;

at least one waterproof breathable unit correspondingly provided at said at least one through hole as a protective layer, said waterproof breathable unit is tightly attached to an inner side of each said though hole and said waterproof breathable unit is made of a material selected from the group consisting of nylon, polypropylene, polyethylene, and polyester, and any combination thereof; and each said waterproof breathable unit having an area not smaller than said through hole.

17. The waterproof heat dissipating structure for electronic signboard as claimed in claim 16, wherein said waterproof breathable unit is formed or provided with a plurality of micro pores that allow gas but not liquid to penetrate therethrough.

18. The waterproof heat dissipating structure for electronic signboard as claimed in claim 17, wherein said waterproof breathable unit is removable from said through hole on said main body of said electronic signboard for cleaning and then replaced on said through hole.

19. The waterproof heat dissipating structure for electronic signboard as claimed in claim 16, wherein said waterproof breathable unit is removable from said through hole on said main body of said electronic signboard for cleaning and then replaced on said through hole.

* * * * *